United States Patent
Cao (10) Patent No.: US 11,404,332 B2
(45) Date of Patent: Aug. 2, 2022

(54) ARRAY SUBSTRATE AND FABRICATION METHOD THEREOF, AND DISPLAY DEVICE

(71) Applicants: BOE TECHNOLOGY GROUP CO., LTD., Beijing (CN); HEFEI XINSHENG OPTOELECTRONICS TECHNOLOGY CO., LTD., Anhui (CN)

(72) Inventor: Binbin Cao, Beijing (CN)

(73) Assignees: BOE TECHNOLOGY GROUP CO., LTD., Beijing (CN); HEFEI XINSHENG OPTOELECTRONICS TECHNOLOGY CO., LTD., Anhui (CN)

( * ) Notice: Subject to any disclaimer, the term of this patent is extended or adjusted under 35 U.S.C. 154(b) by 879 days.

(21) Appl. No.: 16/090,396

(22) PCT Filed: Jan. 23, 2018

(86) PCT No.: PCT/CN2018/073801
§ 371 (c)(1),
(2) Date: Oct. 1, 2018

(87) PCT Pub. No.: WO2019/000928
PCT Pub. Date: Jan. 3, 2019

(65) Prior Publication Data
US 2021/0272859 A1    Sep. 2, 2021

(30) Foreign Application Priority Data

Jun. 28, 2017    (CN) .................. 201710506253.X (51) Int. Cl.
*G01R 31/12*    (2020.01)
*H01L 21/66*    (2006.01)
(Continued)

(52) U.S. Cl.
CPC .......... *H01L 22/32* (2013.01); *G01R 31/1227* (2013.01); *H01L 22/12* (2013.01);
(Continued)

(58) Field of Classification Search
CPC ..... H01L 22/32; H01L 22/12; H01L 27/1225; H01L 27/124; H01L 27/1259; H01L 29/7869; G01R 31/1227
(Continued)

(56) References Cited

U.S. PATENT DOCUMENTS 5,747,380 A * 5/1998 Yu .................. H01L 21/768
                                                  438/599
6,188,461 B1 * 2/2001 Moon ................ C03C 17/22
                                                  349/187
(Continued)

FOREIGN PATENT DOCUMENTS

CN    102636929 A    8/2012
CN    102856230 A    1/2013
(Continued)

OTHER PUBLICATIONS

International Search Report of corresponding PCT/CN2018/073801 dated Apr. 16, 2018 with English translation.
(Continued)

*Primary Examiner* — Dzung Tran
(74) *Attorney, Agent, or Firm* — Nath, Goldberg & Meyer; Joshua B. Goldberg (57) ABSTRACT

The present disclosure provides an array substrate, a fabrication method thereof and a display device. The array substrate includes an insulating layer provided with a first via therein. The array substrate further includes a detection structure including a first conductive structure, a second conductive structure and an insulating structure therebetween. The insulating structure is a portion of the insulating
(Continued)

layer. The second conductive structure includes a first portion and a second portion which are separated from each other, and the first portion and the second portion partially overlap with the first conductive structure in a thickness direction of the array substrate, respectively. A second via is provided in the insulating structure between overlapping portions of the first portion and the first conductive structure, and a third via is provided in the insulating structure between overlapping portions of the second portion and the first conductive structure.

9 Claims, 4 Drawing Sheets

(51) Int. Cl.
*H01L 27/12* (2006.01)
*H01L 29/786* (2006.01)

(52) U.S. Cl.
CPC ........ *H01L 27/124* (2013.01); *H01L 27/1225* (2013.01); *H01L 27/1259* (2013.01); *H01L 29/7869* (2013.01)

(58) Field of Classification Search
USPC .......................................... 257/43
See application file for complete search history.

(56) References Cited

U.S. PATENT DOCUMENTS

| | | | |
|---|---|---|---|
| 8,940,551 B2 | 1/2015 | Que | |
| 8,958,036 B2 | 2/2015 | Cheng | |
| 2003/0071952 A1* | 4/2003 | Yoshida | G02F 1/134363 |
| | | | 349/141 |
| 2005/0110915 A1* | 5/2005 | Lee | G02F 1/136259 |
| | | | 349/43 |
| 2007/0146622 A1* | 6/2007 | Yang | G02F 1/1341 |
| | | | 349/187 |
| 2012/0091997 A1* | 4/2012 | Huang | G09G 3/3655 |
| | | | 324/123 R |

FOREIGN PATENT DOCUMENTS

| | | |
|---|---|---|
| CN | 103165577 A | 6/2013 |
| CN | 107123655 A | 9/2017 |
| JP | 2010-32726 A | 2/2010 |
| JP | 2010032726 A | 2/2010 |

OTHER PUBLICATIONS

Office Action dated Mar. 22, 2019 issued in corresponding Chinese Application No. 201710506253.X.

* cited by examiner

ARRAY SUBSTRATE AND FABRICATION METHOD THEREOF, AND DISPLAY DEVICE

CROSS-REFERENCE TO RELATED APPLICATION

This is a National Phase Application filed under 35 U.S.C. 371 as a national stage of PCT/CN2018/073801, filed on Jan. 23, 2018, an application claiming the benefit of priority to Chinese Patent Application No. 201710506253.X filed on Jun. 28, 2017, the contents of which are incorporated herein in their entirety by reference.

TECHNICAL FIELD

The present disclosure relates to the field of display technology, and particularly relates to an array substrate and a fabrication method thereof, and a display device.

BACKGROUND

With the development of display devices, the demand for oxide active layer is increasing. As a material for an active layer, an oxide semiconductor has advantages such as high carrier mobility, low fabrication temperature, excellent uniformity for a large area, and high light transmissivity, compared with conventional amorphous silicon (a-Si) materials. Due to these advantages, an oxide thin film transistor (Oxide TFT) is suitable for fabricating new display devices such as TFT-LCD, AM-OLED, flexible display, transparent display with high resolution.

SUMMARY

The present disclosure provides an array substrate including an insulating layer provided with a first via therein. The array substrate further includes a detection structure including a first conductive structure (i.e., a first structure), a second conductive structure (i.e., a third structure) and an insulating structure (i.e., a second structure) therebetween, the insulating structure being a portion of the insulating layer. The second conductive structure includes a first portion and a second portion which are separated from each other, the first portion and the second portion partially overlapping with the first conductive structure in a thickness direction of the array substrate, respectively. A second via is provided in the insulating structure between overlapping portions of the first portion and the first conductive structure, and a third via is provided in the insulating structure between overlapping portions of the second portion and the first conductive structure.

According to an embodiment of the present disclosure, the array substrate includes a display area and a non-display area, the insulating layer extends from the non-display area to the display area of the array substrate, the first via is within the non-display area, and the detection structure is within the display area.

According to an embodiment of the present disclosure, the array substrate includes a first conductive layer and a second conductive layer sandwiching the insulating layer therebetween, the first conductive structure of the detection structure is formed in the first conductive layer, and the second conductive structure of the detection structure is formed in the second conductive layer.

According to an embodiment of the present disclosure, the first conductive layer is a gate metal layer, the insulating layer is a gate insulating layer, and the second conductive layer is a data line metal layer.

According to an embodiment of the present disclosure, the second conductive structure of the detection structure is a portion of a data line.

According to an embodiment of the present disclosure, the array substrate includes a plurality of detection structures which are uniformly distributed.

The present disclosure also provides a display device including the array substrate according to the present disclosure.

The present disclosure also provides a fabrication method of an array substrate, and the array substrate is the array substrate according to the present disclosure. The method includes steps of: forming a pattern of the first conductive structure of the detection structure while forming a pattern of the first conductive layer; forming a pattern of the insulating structure of the detection structure while forming a pattern of the insulating layer; forming the second via and the third via in the pattern of the insulating structure of the detection structure while forming the first via in the pattern of the insulating layer; forming a pattern of the second conductive structure of the detection structure while forming a pattern of the second conductive layer, the second conductive structure including a first portion and a second portion which are separated from each other. The first portion and the second portion partially overlap with the first conductive structure in a thickness direction of the array substrate, respectively, the second via is formed in the insulating structure between overlapping portions of the first portion and the first conductive structure, and a third via is formed in the insulating structure between overlapping portions of the second portion and the first conductive structure.

According to an embodiment of the present disclosure, the first conductive structure is a portion of the first conductive layer, the insulating structure is a portion of the insulating layer, and the second conductive structure is a portion of the second conductive layer.

According to an embodiment of the present disclosure, the insulating layer extends from a non-display area of the array substrate to a display area of the array substrate, the first via is formed within the non-display area, and the detection structure is formed within the display area.

According to an embodiment of the present disclosure, the first conductive layer, a gate electrode and a gate line are formed simultaneously using a same material; the insulating layer is a gate insulating layer; and the second conductive layer is a data line metal layer.

According to an embodiment of the present disclosure, the second conductive structure of the detection structure is a portion of a data line.

The present disclosure also provides a detection method of an array substrate, the detection method including steps of: inputting a test signal to a detection structure; detecting the test signal output from the detection structure; determining whether there is any residual material of an insulating layer in a first via of the insulating layer according to whether the test signal is output from the detection structure.

According to an embodiment of the present disclosure, the array substrate includes a display area and a non-display area, the insulating layer extends from the non-display area to the display area, the first via is within the non-display area, and the detection structure is within the display area.

According to an embodiment of the present disclosure, the steps of inputting a test signal to the detection structure and detecting the test signal output from the detection structure include inputting a test signal to the first portion of the second conductive structure and detecting the test signal output from the second portion of the second conductive structure.

According to an embodiment of the present disclosure, the first conductive layer is a gate metal layer, the insulating layer is a gate insulating layer, and the second conductive layer is a data line metal layer.

According to an embodiment of the present disclosure, the second conductive structure of the detection structure is a portion of a data line.

According to an embodiment of the present disclosure, the array substrate includes a plurality of detection structures which are uniformly distributed.

DETAILED DESCRIPTION

In an array substrate having an oxide active layer, a gate metal layer is typically connected to a source and drain metal layer using a lead wire within a non-display area, due to requirements of testing and normal display. In this structure, the lead wire for the gate metal layer needs to pass through a via in a gate insulating layer to be connected to the source and drain metal layer, and the via in the gate insulating layer is formed by exposing and etching the gate insulating layer. However, with the variation of the process, a defect that material of the gate insulating layer remains in the via (GI remain) easily occurs in the etching process of the exposed gate insulating layer. In general, the defect of GI remain can only be detected by inputting a test signal in the array test after completing the fabrication of the array substrate, and then the defect can be dealt with.

Since the gate insulating layer is a transparent film layer, it is difficult for a common optical detecting apparatus (such as PI/AOI/MM, etc.) to identify the minor difference in light transmissivity due to residual material of the gate insulating layer in the via, that is, the residual material of the gate insulating layer in the via cannot be detected by the common optical detecting apparatus. Subsequent formation of film layers (such as 1ITO/PVX/2ITO) on the array substrate with residual material of the gate insulating layer in its via will cause great waste of production cost and production capacity, and the array substrate with residual material of the gate insulating layer in its via cannot be repaired but can only be scrapped.

In view of the above problems, the present disclosure provides an array substrate, which can accurately detect residual material of an insulating layer in a via before completing the fabrication of the array substrate.

To make those skilled in the art better understand the technical solutions of the present disclosure, an array substrate and a fabrication method thereof, and a display device provided in the present disclosure will be further described in detail below in conjunction with the accompanying drawings and the specific implementations.

Figure 1:
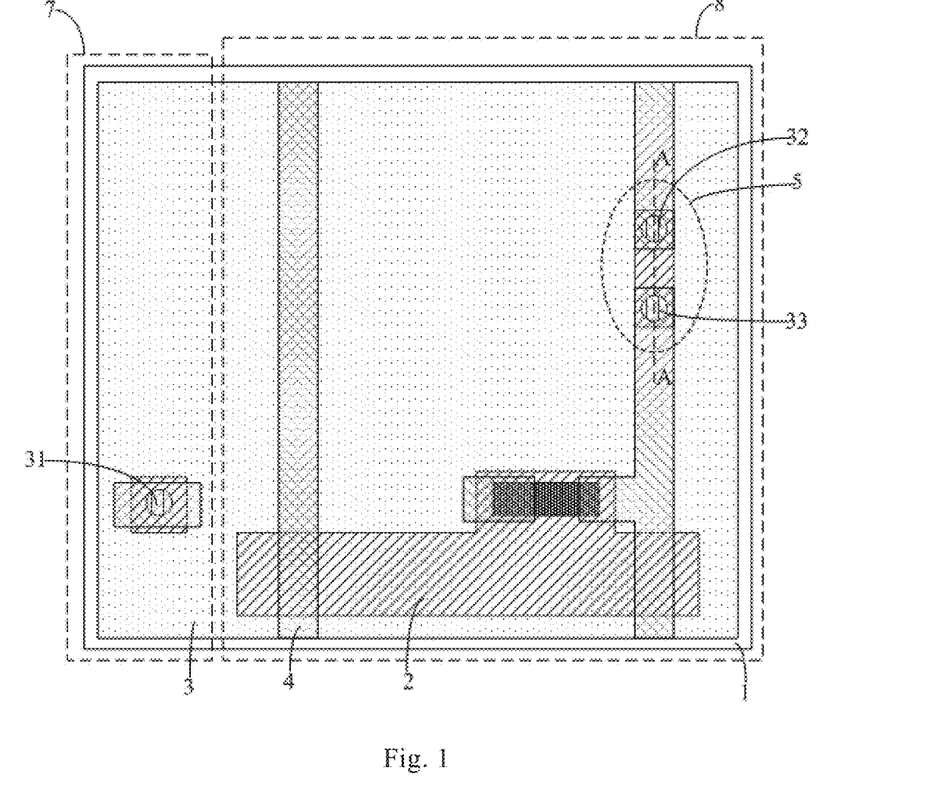
FIG. 1 is a top view schematically showing a structure of an array substrate according to an embodiment of the present disclosure.
Figure 2:
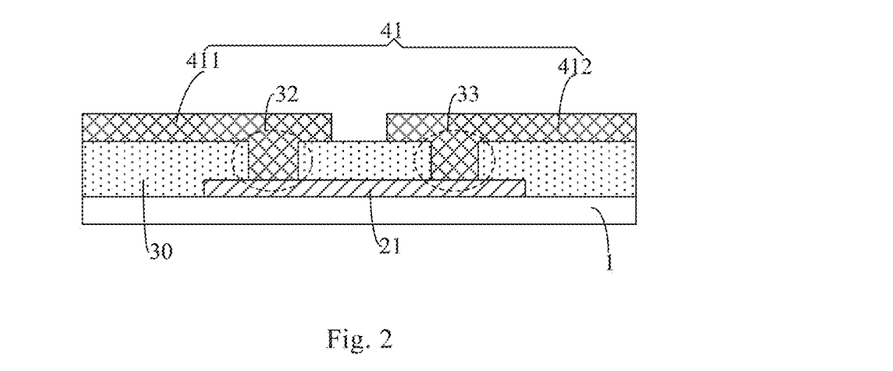
FIG. 2 is a cross-sectional view showing a structure of the array substrate taken along AA line, in a case where there is no residual insulating material in both a second via and a third via in FIG. 1.
Figure 3:
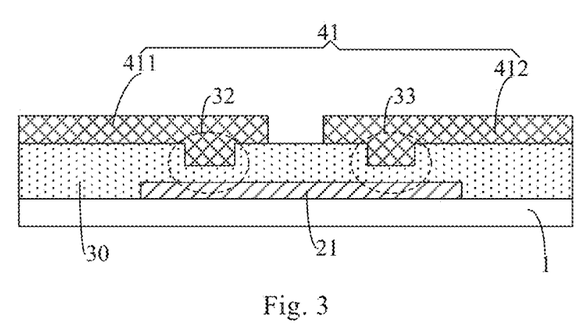
FIG. 3 is a cross-sectional view showing a structure of the array substrate taken along AA line, in a case where there is residual insulating material in both a second via and a third via in FIG. 1.

There is provided an array substrate according to an embodiment of the present disclosure. As shown in FIG. 1 to FIG. 3, the array substrate includes a first conductive layer 2, an insulating layer 3, and a second conductive layer 4 sequentially arranged on a substrate 1 in a direction away from the substrate 1, and a first via 31 is provided in the insulating layer 3. The array substrate further includes a detection structure 5 formed in the first conductive layer 2, the insulating layer 3, and the second conductive layer 4 and configured to detect whether there is any residual material of the insulating layer 3 in the first via 31.

In a case where the first via 31 is in the insulating layer 3, the detection structure 5 can cause the residual insulating material in the first via 31 to be detected in time, so that the connection failure between the first conductive layer 2 and the second conductive layer 4 caused by the residual insulating material in the first via 31 can be detected as early as possible. Compared with the case that the residual insulating material in the first via 31 can only be detected after the fabrication of the array substrate is completed, the waste of the production cost and the production capacity caused by the detection after completing the fabrication of the array substrate is avoided.

The array substrate includes a display area 8 and a non-display area 7. In the present embodiment, the insulating layer 3 extends from the non-display area 7 to the display area 8 of the array substrate, and the first conductive layer 2 and the second conductive layer 4 are distributed within the non-display area 7 and the display area 8 (that is, the first conductive layer 2 and the second conductive layer 4 both are not formed as an entire layer). The first via 31 is within the non-display area 7, and the detection structure 5 is within the display area 8. The first conductive layer 2 needs to be electrically connected to the second conductive layer 4 through the first via 31 within the non-display area 7 of the array substrate considering the requirements of testing and normal display. The detection structure 5 is provided within the display area 8, and whether there is residual insulating material in the first via 31 of the non-display area 7 can be detected and reflected by performing a signal testing on the first conductive layer 2 and the second conductive layer 4 after the respective film structures of the first conductive layer 2 and the second conductive layer 4 are formed within the display area 8 but before completing the fabrication of the array substrate, so that the connection failure between the first conductive layer 2 and the second conductive layer 4 caused by the residual insulating material in the first via 31 can be detected as early as possible, thus avoiding the waste of the production cost and the production capacity caused by the detection after the fabrication of the array substrate is completed. It can be understood that the "display area" herein refers to an area of an array substrate for image display, and the "non-display area" refers to an area of the array substrate other than the "display area".

In the present embodiment, as shown in FIG. 2 and FIG. 3, the detection structure 5 includes a first structure 21 (corresponding to the first conductive structure), a second structure 30 (corresponding to the insulating structure), and a third structure 41 (corresponding to the second conductive structure) sequentially arranged on the substrate 1. The first structure 21 is a portion of the first conductive layer 2, the second structure 30 is a portion of the insulating layer 3, and the third structure 41 is a portion of the second conductive layer 4. The third structure 41 includes a first portion 411 and a second portion 412 which are separated from each other, and the first portion 41 and the second portion 42 partially overlap with the first structure 21 in a thickness direction of the array substrate, respectively. A second via 32 is provided in the second structure 30 between overlapping portions of the first portion 411 and the first structure 21, and a third via 33 is in the second structure 30 between overlapping portions of the second portion 412 and the first structure 21.

In a case where there is no residual material of the second structure 30 in both the second via 32 and the third via 33, the first portion 411 of the third structure 41 may be electrically connected to the second portion 412 of the third structure 41 through the second via 32, the third via 33, and the first structure 21 (as shown in FIG. 2). In a case where there is residual material of the second structure 30 in the second via 32 and/or the third via 33 (or, in a case where the second via 32 and/or the third via 33 do not penetrate through the entire second structure 30), the first portion 411 of the third structure 41 cannot be electrically connected to the second portion 412 of the third structure 41 through the second via 32, the third via 33, and the first structure 21 (as shown in FIG. 3). Although the case where there is residual material of the second structure 30 in both the second via 32 and the third via 33 is shown in FIG. 3, it can be understood that even if there is residual material of the second structure 30 in only one of the second via 32 and the third via 33, the first portion 411 and the second portion 412 of the third structure 41 cannot be electrically connected to each other through the second via 32, the third via 33, and the first structure 21.

A specific process of testing whether there is residual material of the second structure 30 in the second via 32 and/or the third via 33 includes inputting a test signal to one end of the third structure 41 (for example, the first portion 411). If the test signal is detected at the other end of the third structure 41 (for example, the second portion 412), which means the first portion 411, the second via 32, the first structure 21, the third via 33, and the second portion 412 forms a conductive path, there is no residual material of the second structure 30 in both the second via 32 and the third via 33. If the test signal is not detected at the other end of the third structure 41 (for example, the second portion 412), which means the test signal is not transmitted to the other end of the third structure 41, there is residual material of the second structure 30 in the second via 32 and/or the third via 33.

With the detection structure 5 within the display area 8, whether there is any residual material of the second structure 30 in the second via 32 and the third via 33 can be determined by inputting the test signal to one end of the third structure 41 and determining whether the test signal can be received at the other end of the third structure 41. According to the residue of the insulating material in the second via 32 and the third via 33 of the second structure 30, it is possible to judge the condition of vias of the insulating layer 3, thereby determining whether there is residual insulating material in the first via 31 of the insulating layer 3 within the non-display area 7. Since the residual insulating material in the via of the insulating layer 3 is mainly caused by variation in fabrication process during the fabrication of the insulating layer 3 and the via thereof, or by delayed maintenance of the fabrication apparatus, and as long as there is residual insulating material in one via of the insulating layer 3, vias of the insulating layer 3 have defect. Note that the defect here means that there is residual insulating material in a via. Therefore, the residual insulating material in the first via 31 of the insulating layer 3 within the non-display area 7 may be identified by detecting the residual insulating material in the second via 32 and the third via 33 of the second structure 30 within the display area 8.

According to an embodiment of the present disclosure, to meet the requirements of testing and normal display, the first conductive layer 2 within the display area 7 may be a gate metal layer, the second conductive layer 4 within the display area 7 may be a data line metal layer, and the insulating layer 3 may be a gate insulating layer. The gate metal layer is in the same layer and has the same material as a gate electrode and a gate line, but the gate metal layer is not connected to the gate electrode and the gate line, and is used as the first structure 21 of the detection structure 5 within the display area 8. The gate insulating layer extends from the non-display area 7 to the display area 8, and a portion of the gate insulating layer within the display area 8 can be used as the second structure 30 of the detection structure 5 while the gate insulating layer serves as the gate insulating layer of the array substrate. The third structure 41 of the detection structure 5 is a portion of the data line. In addition, the second conductive layer 4 within the non-display area 7 is a metal layer provided in the same layer and formed of the same material as the data line. In this way, whether there is residual insulating material in the second via 32 and the third via 33 of the detection structure 5 can be detected when signal testing is performed on a data line within the display area 8 after completing the fabrication of the data line. Therefore, it is possible to detect whether there is residual insulating material in the via of the gate insulating layer in advance, after completing the fabrication of the data line on the array substrate, rather than after completing fabrication of other film layers on the array substrate (such as 1ITO/PVX/2ITO), thereby greatly reducing the waste of the production cost and the production capacity.

It should be noted that the insulating layer 3 may also be other insulating layer on the array substrate. Accordingly, the first conductive layer 2 and the second conductive layer 4 may also be other conductive film layers disposed under and above the insulating layer 3 respectively. In this way, it is also possible to detect whether there is any residual insulating material in the vias of the other insulating layers.

Figure 4:
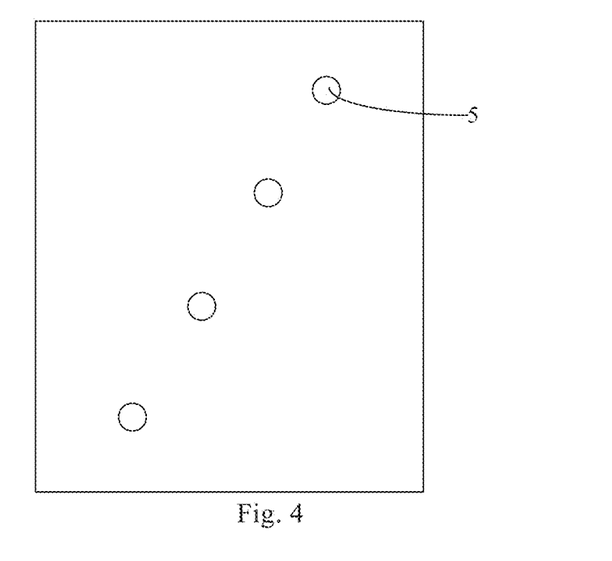
FIG. 4 is a schematic view showing a distribution of a detection structure of an array substrate according to an embodiment of the present disclosure.

In the present embodiment, as shown in FIG. 4, the array substrate may include a plurality of detection structures 5, and the plurality of detection structures 5 are evenly distributed. With the arrangement of the plurality of detection structures 5, it is possible to detect whether there is any residual insulating material in the via of the insulating layer 3 more accurately, and it is also possible to avoid missed detection of presence of the residual insulating material in the via caused by only a single detection structure 5, considering there may be no residual insulating material in some vias. As long as there is residual insulating material in one via of the insulating layer 3, it means vias in the insulating layer 3 have defect, and the insulating layer 3 needs to be repaired.

According to an embodiment of the present disclosure, the third structure 41 of the detection structure 5 may be arranged at any position of the data line (the first structure 21 of the detection structure 5 and the second via 32 and the third via 33 of the second structure 30 are arranged correspondingly to the third structure 41). Since a portion of the data line is used as the third structure 41 of the detection structure 5, and the test signal loaded onto the data line passes through the entire data line, it is possible to detect whether there is residual insulating material in the second via 32 and the third via 33, regardless of the position of the third structure 41 of the detection structure 5 in the data line.

The present embodiment further provides a fabrication method of an array substrate, based on the above structure of the array substrate. As shown in FIGS. 5-8, the method includes steps of forming a first conductive layer 2, an insulating layer 3 having a first via 31, and a second conductive layer 4 sequentially on a substrate 1, and forming a detection structure 5 in the first conductive layer 2, the insulating layer 3 and the second conductive layer 4, the detection structure 5 being configured to detect whether there is any residual material of the insulating layer 3 in the first via 31.

According to an embodiment of the present disclosure, the step of forming the detection structure 5 in the first conductive layer 2, the insulating layer 3, and the second conductive layer 4 includes steps S101 to S104.

Figure 5:
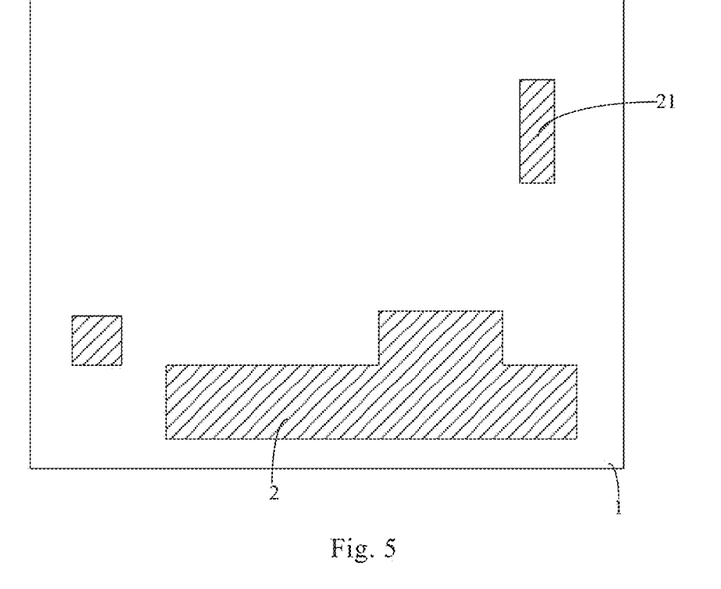
FIG. 5 is a schematic view of a pattern forming a first structure in a detection structure.

Step S101 includes forming a pattern of a first structure 21 of the detection structure 5 is formed while forming a pattern of the first conductive layer 2 on the substrate 1 (as shown in FIG. 5).

In this step, patterns of the first conductive layer 2 within the non-display area 7 are formed simultaneously. The first conductive layer 2 is formed of the same material and at the same time as a gate electrode and a gate line; that is, the first structure 21 of the detection structure 5 within the display area 8 is formed of the same material and at the same time as the first conductive layer 2 within the non-display area 7, the gate electrode and the gate line. The pattern of the first conductive layer 2 and the pattern of the first structure 21 are formed by conventional patterning processes (including process steps such as film deposition, exposure, development, etching, etc.), and details thereof are not described herein.

Figure 6:
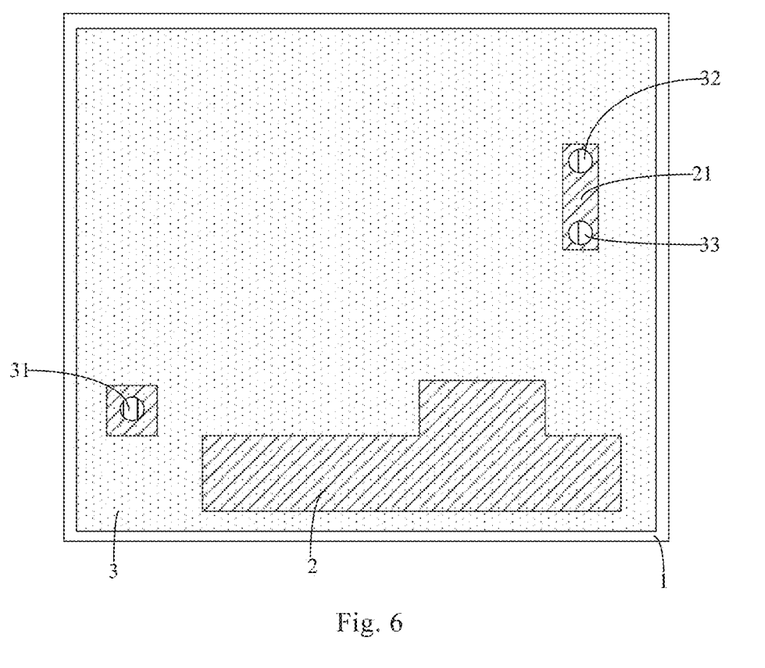
FIG. 6 is a schematic view of forming a pattern of a second structure in a detection structure and forming a second via and a third via in the second structure.

Step S102 includes forming a pattern of the second structure 30 of the detection structure 5 while forming a pattern of the insulating layer 3, and forming a second via 32 and a third via 33 in the second structure 30 of the detection structure 5 while forming a first via 31 in the pattern of the insulating layer 3 (as shown in FIG. 6).

The insulating layer 3 is formed of the same material and at the same time as a gate insulating layer. The pattern of the insulating layer 3, the pattern of the second structure 30, the first via 31, the second via 32 and the third via 33 are formed by conventional patterning processes (including process steps such as film deposition, exposure, development, etching, etc.), and details thereof are not described herein.

Figure 7:
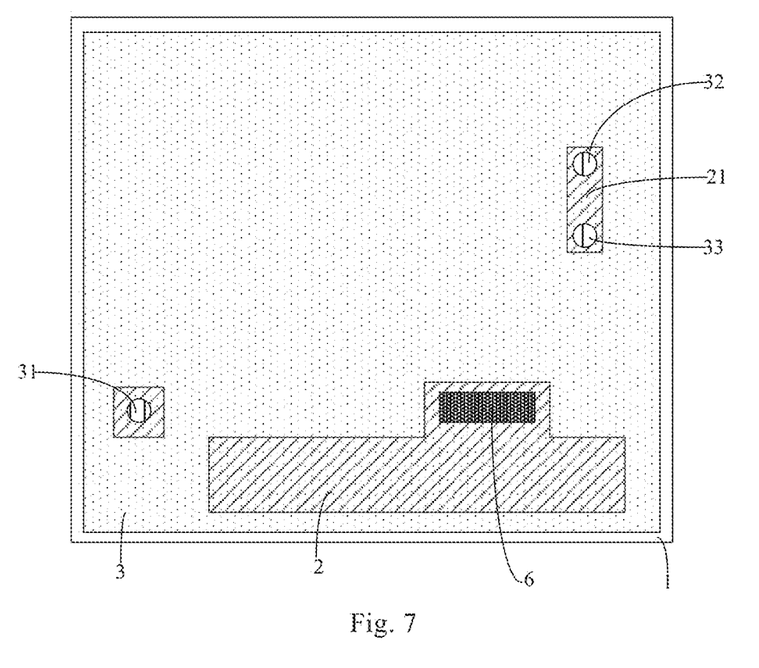
FIG. 7 is a schematic view of forming a pattern of an active layer within a display area.

Step S103 includes forming a pattern of an active layer 6 within the display area 8 (as shown in FIG. 7).

In this step, the pattern of an active layer 6 is formed by a conventional patterning process (including process steps such as film deposition, exposure, development, etching, etc.), and details thereof are not described herein.

Figure 8:
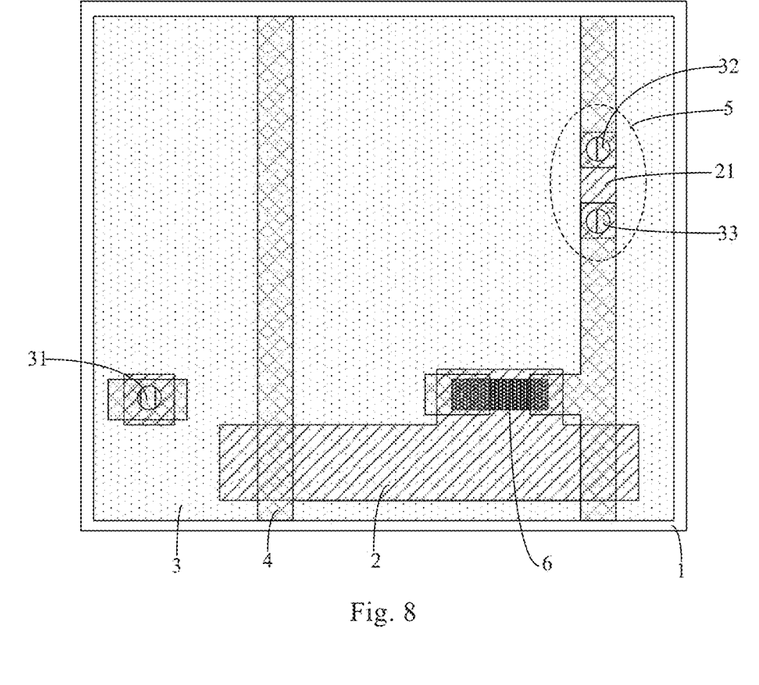
FIG. 8 is a schematic view of forming a pattern of a third structure in a detection structure.

Step S104 includes forming a pattern of a third structure 41 of the detection structure 5 while forming a pattern of a second conductive layer 4 (as shown in FIG. 8).

In this step, the second conductive layer 4 is formed of the same material and at the same time as a data line; specifically, the third structure 41 of the detection structure 5 within the display area 8 is formed of the same material and at the same time as the second conductive layer 4 within the non-display area 7, a source electrode, a drain electrode and the data line. The pattern of the second conductive layer 4 and the pattern of the third structure 41 are formed by conventional patterning processes (including process steps such as film deposition, exposure, development, etching, etc.), and details thereof are not described herein.

In the present embodiment, in Step S104, the step of forming a pattern of a third structure 41 of the detection structure 5 while forming a pattern of a second conductive layer 4 includes forming patterns of a first portion 411 and a second portion 412 of the third structure 41, the first portion 411 and the second portion 412 being separated from each other.

As described above, the first portion 411 and the second portion 412 of the third structure 41 partially overlap with the first structure 21 in a thickness direction of the array substrate, respectively, the second via 32 is provided in a portion of the second structure 30 between overlapping portions of the first portion 411 and the first structure 21, and the third via 33 is provided in a portion of the second structure 30 between overlapping portions of the second portion 412 and the first structure 21.

It should be noted that other film layers on the array substrate and methods for fabricating the same are not shown in the drawings.

In addition, the embodiment further provides a detection method of the above array substrate, including: inputting a test signal to the detection structure formed in the first conductive layer, the insulating layer and the second conductive layer to detect whether there is any residual material of the insulating layer in the first via of the insulating layer.

A specific process of testing whether there is any residual material of the second structure 30 in the second via 32 and/or the third via 33 includes: as shown in FIG. 2 and FIG. 3, inputting a test signal to one end of the third structure 41 (e.g., the first portion 411). If the test signal is detected at the other end of the third structure 41 (e.g., the second portion 412), it means the first portion 411, the second via 32, the first structure 21, the third via 33 and the second portion 412 form a conductive path, and thus there is no residual material of the second structure 30 in both the second via 32 and the third via 33. If the test signal is not detected at the other end of the third structure 41, it means the test signal is not transmitted to the other end of the third structure 41, and thus there is residual material of the second structure 30 in the second via 32 and/or the third via 33. When a test signal is applied to one end of the third structure 41, the detection structure 5 in the display area 8 can determine whether there is residual material of the second structure 30 in the second via 32 and/or the third via 33 by determining whether the test signal can be detected at the other end of the third structure 41. According to the residue of the insulating material in the second via 32 and the third via 33 of the second structure 30, it is possible to judge the condition of the via in the insulating layer 3, thereby determining whether there is residual insulating material in the first via 31 of the insulating layer 3 within the non-display area 7. Since the residual insulating material in the via of the insulating layer 3 is mainly caused by variation in the fabricating process during the fabrication of the insulating layer 3 and the vias thereof, or by delayed maintenance of the fabrication apparatus, and as long as there is residual insulating material in one via in the insulating layer 3, vias in the insulating layer 3 have defect. Note that the defect here means that via does not penetrate through the first insulating layer 3 completely, or there is residual insulating material in the via. Therefore, the residual insulating material in the first via 31 of the insulating layer 3 within the non-display area 7 may be identified by detecting the residual insulating material in the second via 32 and the third via 33 of the second structure 30 within the display area 8.

In summary, the disclosure has the following beneficial effects. A detection structure is disposed in a first conductive layer, an insulating layer, and a second conductive layer, which allows the residual insulating material in the first via of the insulating layer to be detected in time, and thereby the connection failure of the first conductive layer and the second conductive layer caused by the residual insulating material in the first via can be detected as early as possible. Compared with the case that the residual insulating material in the first via can only be detected after the fabrication of the array substrate is completed, the waste of the production cost and the production capacity caused by the detection performed after the fabrication of the array substrate is completed is avoided.

The present disclosure also provides a display device including the array substrate in the above embodiment.

By adopting the array substrate in the above embodiment, the fabrication quality of the insulating layer can be detected in advance before the fabrication of the display device is completed, thereby greatly reducing the waste of the production cost and the display device.

The display device provided by the present disclosure may be any product or component having a display function such as a liquid crystal panel, a liquid crystal television, an OLED panel, an OLED television, a display, a mobile phone, a navigator or the like.

It could be understood that the above embodiments are merely exemplary embodiments adopted for describing the principle of the present disclosure, but the present disclosure is not limited thereto. Various variations and improvements may be made by those of ordinary skill in the art without departing from the spirit and essence of the present disclosure, and these variations and improvements shall also be regarded as falling into the protection scope of the present disclosure.

The invention claimed is:

1. An array substrate having a display area and a non-display area,
wherein the array substrate comprises a gate insulating layer provided with a first via therein, and a gate metal layer and a data layer and a data line on opposite sides of the gate insulating layer,
the insulating layer extends from the non-display area to the display area of the array substrate, the first via is within the non-display area,
the array substrate further comprises a detection structure in the non-display area, the detection structure comprising a first conductive structure, a second conductive structure and an insulating structure between the first conductive structure and the second conductive structure, the insulating structure being a portion of the gate insulating layer, the first conductive structure being a portion of the gate metal layer, and the second conductive structure being a portion of the data line,
the second conductive structure comprises a first portion and a second portion which are separated from each other, the first portion and the second portion partially overlapping with the first conductive structure in a thickness direction of the array substrate, respectively,
a second via is provided in the insulating structure between overlapping portions of the first portion and the first conductive structure, and a third via is provided in the insulating structure between overlapping portions of the second portion and the first conductive structure, and
the first portion is configured to receive a test signal, and the second portion is configured to provide an output signal.

2. The array substrate of claim 1, wherein the array substrate comprises a plurality of detection structures which are uniformly distributed.

3. A display device comprising an array substrate, wherein the array substrate has a display area and a non-display area, and comprises a gate insulating layer provided with a first via therein, and a gate metal layer and a data line on opposite sides of the gate insulating layer,
the insulating layer extends from the non-display area to the display area of the array substrate, the first via is within the non-display area,
the array substrate further comprises a detection structure in the non-display area, the detection structure comprising a first conductive structure, a second conductive structure and an insulating structure between the first conductive structure and the second conductive structure, the insulating structure being a portion of the gate insulating layer, the first conductive structure being a portion of the gate metal layer, and the second conductive structure being a portion of the data line,
the second conductive structure comprises a first portion and a second portion which are separated from each other, the first portion and the second portion partially overlapping with the first conductive structure in a thickness direction of the array substrate, respectively,
a second via is provided in the insulating structure between overlapping portions of the first portion and the first conductive structure, and a third via is provided in the insulating structure between overlapping portions of the second portion and the first conductive structure, and
the first portion is configured to receive a test signal, and the second portion is configured to provide an output signal.

4. A fabrication method of an array substrate, the array substrate being the array substrate of claim 1, the fabrication method comprising steps of:
forming a pattern of the first conductive structure of the detection structure while forming a pattern of the first conductive layer;
forming a pattern of the insulating structure of the detection structure while forming a pattern of the gate insulating layer;
forming the second via and the third via in the pattern of the insulating structure of the detection structure while forming the first via in the pattern of the gate insulating layer;
forming a pattern of the second conductive structure of the detection structure while forming a pattern of the second conductive layer, the second conductive structure comprising a first portion and a second portion which are separated from each other, wherein
the first portion and the second portion partially overlap with the first conductive structure in a thickness direction of the array substrate, respectively, the second via is formed in the insulating structure between overlapping portions of the first portion and the first conductive structure, and the third via is formed in the insulating structure between overlapping portions of the second portion and the first conductive structure, and the first portion is configured to receive a test signal, and the second portion is configured to provide an output signal.

5. The fabrication method of claim 4, wherein the first conductive structure is a portion of the first conductive layer, the insulating structure is a portion of the insulating layer, and the second conductive structure is a portion of the second conductive layer.

6. The fabrication method of claim 4, wherein
the first conductive layer, a gate electrode and a gate line are formed simultaneously using a same material; and the second conductive layer is a data line metal layer.

7. The fabrication method of claim 5, wherein
the first conductive layer, a gate electrode and a gate line are formed simultaneously using a same material; and the second conductive layer is a data line metal layer.

8. A detection method of an array substrate, the array substrate being the array substrate of claim 1, the detection method comprising steps of:
inputting a test signal to the first portion of the second conductive structure;
detecting the test signal output from the second portion of the second conductive structure;
determining whether there is residual material of the insulating layer in the first via of the insulating layer according to whether the test signal is output from the second portion of the second conductive structure.

9. The detection method of claim 8, wherein the array substrate comprises a plurality of detection structures which are uniformly distributed.

* * * * *